United States Patent
Yonekawa

(10) Patent No.: US 7,855,436 B2
(45) Date of Patent: Dec. 21, 2010

(54) SEMICONDUCTOR WAFER

(75) Inventor: Kiyotaka Yonekawa, Miyazaki (JP)

(73) Assignee: OKI Semiconductor Co., Ltd, Tokyo (JP)

(*) Notice: Subject to any disclaimer, the term of this patent is extended or adjusted under 35 U.S.C. 154(b) by 253 days.

(21) Appl. No.: 12/153,086

(22) Filed: May 14, 2008

(65) Prior Publication Data
US 2009/0001521 A1    Jan. 1, 2009

(30) Foreign Application Priority Data
Jun. 27, 2007    (JP)    ............ 2007-169660

(51) Int. Cl.
*H01L 23/544* (2006.01)
(52) U.S. Cl. .................. 257/620; 257/E23.179; 257/E21.599; 257/E21.523; 257/E21.524
(58) Field of Classification Search .......... 257/620, 257/E23.179, E21.596, E21.599, E21.523, 257/E21.524; 438/68, 113, 114, 458, 460–465
See application file for complete search history.

(56) References Cited

U.S. PATENT DOCUMENTS 6,465,897 B1 *   10/2002   Shih et al. ............... 257/797

FOREIGN PATENT DOCUMENTS

JP    57-172750    * 10/1982    .......... 257/E21.599
JP    2005-223304    8/2005

* cited by examiner

*Primary Examiner*—Jasmine J Clark
(74) *Attorney, Agent, or Firm*—Kubotera & Associates LLC

(57) ABSTRACT

A semiconductor wafer includes an insulation substrate with transparency; a silicon semiconductor layer formed on the insulation substrate; a chip forming area defined on the silicon semiconductor layer; a scribe line area defined on the silicon semiconductor layer for dividing the chip forming area; and an opaque pattern layer formed in the scribe line area. A plurality of opaque pattern portions is arranged apart from each other in the opaque pattern layer.

7 Claims, 10 Drawing Sheets

SEMICONDUCTOR WAFER

BACKGROUND OF THE INVENTION AND RELATED ART STATEMENT

The present invention relates to a semiconductor wafer. In particular, the present invention relates to a semiconductor wafer such as an SOS (Silicon On Sapphire) wafer having an insulation substrate with transparency.

In a manufacturing process of a semiconductor chip, when a semiconductor wafer is processed with a manufacturing device, it is necessary to confirm a presence of the semiconductor wafer on a side of the manufacturing device. In this case, a transmission type sensor is generally used for detecting the presence of the semiconductor wafer through light transmission or blocking light having a wavelength of 670 to 940 nm with an LED (Light Emitting Diode) as a light source.

In a case of a silicon (Si) wafer, there is no problem in detecting the semiconductor wafer with a transmission type sensor using light having a wavelength of 670 to 940 nm. Recently, however, an SOS (Silicon on Sapphire) wafer has been used for manufacturing a high-value added product such as an RF (Radio Frequency) device and the likes.

In the SOS (Silicon on Sapphire) wafer, a thin semiconductor layer is formed on a sapphire substrate. In a case of the SOS (Silicon on Sapphire) wafer, sapphire has transparency with respect to light having a wavelength of 670 to 940 nm, so that light transmits through the sapphire substrate. Accordingly, it is difficult to confirm a presence of the SOS (Silicon on Sapphire) wafer during a manufacturing process of a semiconductor chip.

In general, during a manufacturing process of a semiconductor chip, after a semiconductor element constituting a semiconductor chip is formed on the SOS (Silicon on Sapphire) wafer, a scribe line is formed in the SOS (Silicon on Sapphire) wafer, so that the semiconductor chip is cut into individual pieces. Normally, an alignment mark is formed on the scribe line for photolithography. Further, a TEG (Test Element Group) is formed on the scribe line for testing an electrical property of the semiconductor element.

Accordingly, an area of the SOS wafer is transparent other than areas where the scribe line, the alignment mark, and the TEG are formed. As a result, light transmits through the SOS wafer toward the transmission type sensor at a higher percentage. Therefore, even though the SOS wafer exists, it is difficult to confirm the presence of the SOS wafer during the manufacturing process of the semiconductor chip.

When it fails to confirm the presence of the SOS wafer, the SOS passes through a specific step without processing, thereby reducing a production yield and production efficiency of the semiconductor chips. In order to securely confirm the presence of the SOS wafer, a wavelength of light incident on the transmission type sensor may be adjusted, thereby confirming the presence of the SOS wafer at a high percentage.

Patent Reference has disclosed another technology for securely confirming the presence of the SOS wafer. In the technology, an outer contour portion having a width of about 5 mm is defined in an outer circumferential portion of the SOS wafer. Then, a photo resist mask is formed on a silicon semiconductor layer through photolithography, so that the outer contour portion is exposed. Ions are implanted into the silicon semiconductor layer in the outer contour portion with the photo resist mask as a mask, so that the silicon semiconductor layer in the outer contour portion becomes amorphous.

When the outer contour portion becomes amorphous, the outer contour portion becomes opaque. Accordingly, it is possible to securely confirm the presence of the SOS wafer. Patent Reference: Japanese Patent Publication No. 2005-223304

In the conventional technology described above, as compared with the case of detecting a semiconductor wafer with a transmission type sensor using light having a wavelength of 670 to 940 nm, it is possible to improve a recognition rate of the semiconductor wafer. However, the recognition rate of the SOS wafer is still not sufficient as opposed to that of the silicon wafer. Accordingly, it is still difficult to produce the semiconductor chip with a high yield, thereby reducing production efficiency of the semiconductor chip.

In the technology disclosed in Patent Reference, the outer contour portion disposed in the outer circumferential portion of the SOS wafer becomes amorphous and opaque. Accordingly, the outer contour portion is not utilized for producing the semiconductor chip, thereby reducing a chip forming area for forming the semiconductor chip. As a result, the number of the semiconductor chips produced from one SOS wafer decreases, thereby reducing production efficiency of the semiconductor chips.

In the technology disclosed in Patent Reference, it is necessary to provide an additional step for making the outer contour portion amorphous. Accordingly, it takes a longer period of time to produce the semiconductor chips, thereby increasing a production cost of the semiconductor chips.

In view of the problems described above, an object of the present invention is to provide and a semiconductor wafer capable of solving the problems of the conventional semiconductor wafer. In the semiconductor wafer, it is possible to improve a recognition rate of the semiconductor wafer such as an SOS wafer without reducing a chip forming area for producing a semiconductor chip.

Further objects and advantages of the invention will be apparent from the following description of the invention.

SUMMARY OF THE INVENTION

In order to attain the objects described above, according to the present invention, a semiconductor wafer includes an insulation substrate with transparency; a silicon semiconductor layer formed on the insulation substrate; a chip forming area defined on the silicon semiconductor layer; a scribe line area defined on the silicon semiconductor layer for dividing the chip forming area; and an opaque pattern layer formed in the scribe line area. A plurality of opaque pattern portions is arranged apart from each other in the opaque pattern layer.

In the present invention, using opaqueness of the opaque pattern portions, it is possible to improve a recognition rate of the semiconductor wafer such as an SOS wafer without reducing a chip forming area for producing a semiconductor chip. Accordingly, it is possible to improve a production yield and production efficiency of the semiconductor chip.

DETAILED DESCRIPTION OF PREFERRED EMBODIMENTS

Figure 1:
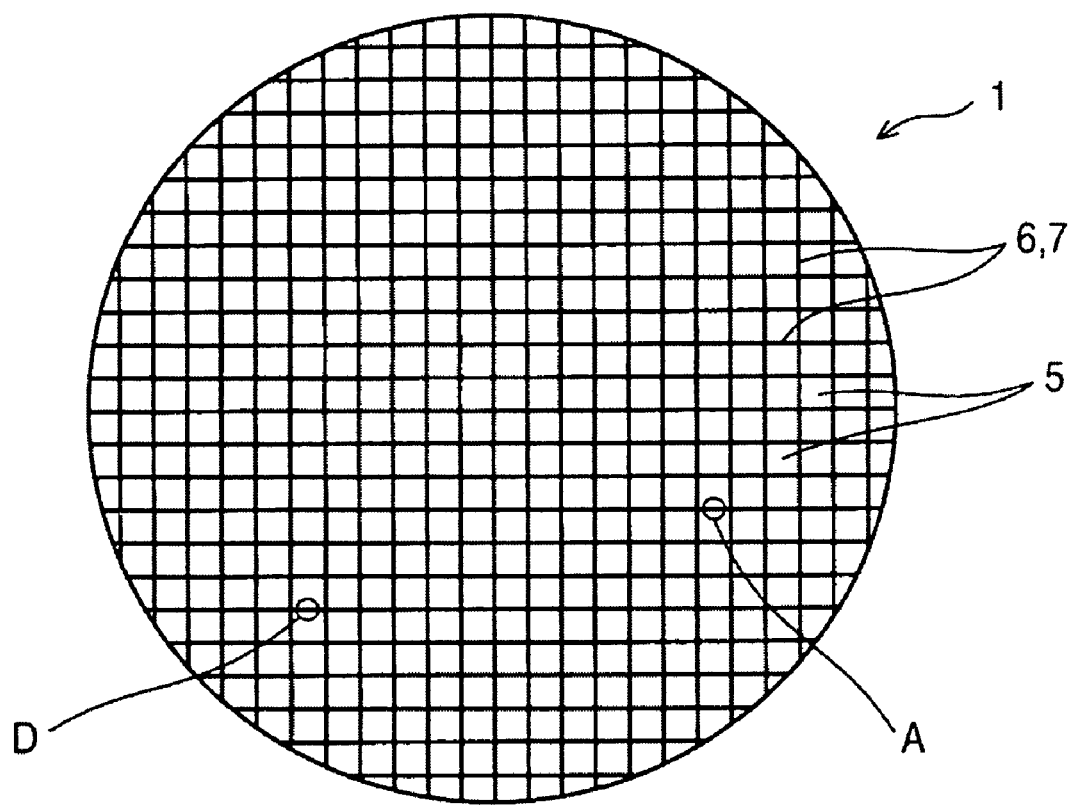
FIG. 1 is a schematic plan view showing a semiconductor wafer according to an embodiment of the present invention.

Hereunder, embodiments of the present invention will be explained with reference to the accompanying drawings. In the following description of the present invention, each of the drawings is illustrated schematically in terms of a shape, a size, and a dimensional relationship for explaining the embodiments of the present invention, and the present invention is not limited to the shape, the size, and the dimensional relationship shown in the drawings.

Figure 2:
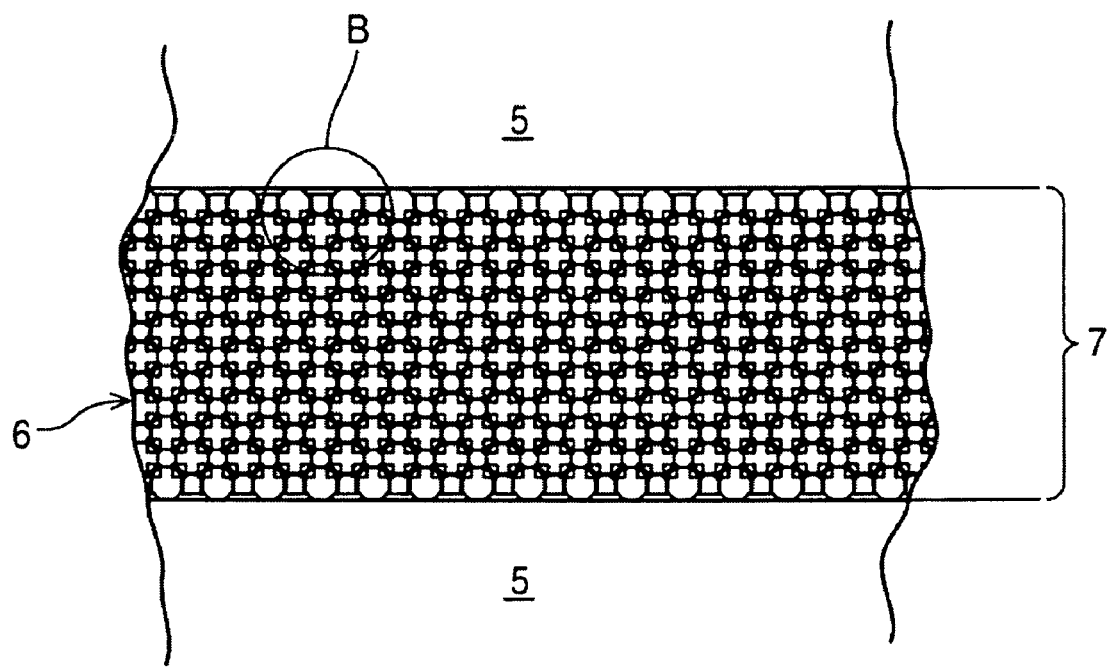
FIG. 2 is an enlarged view of a part A in FIG. 1 showing a scribe line of the semiconductor wafer according to the embodiment of the present invention.
Figure 3:
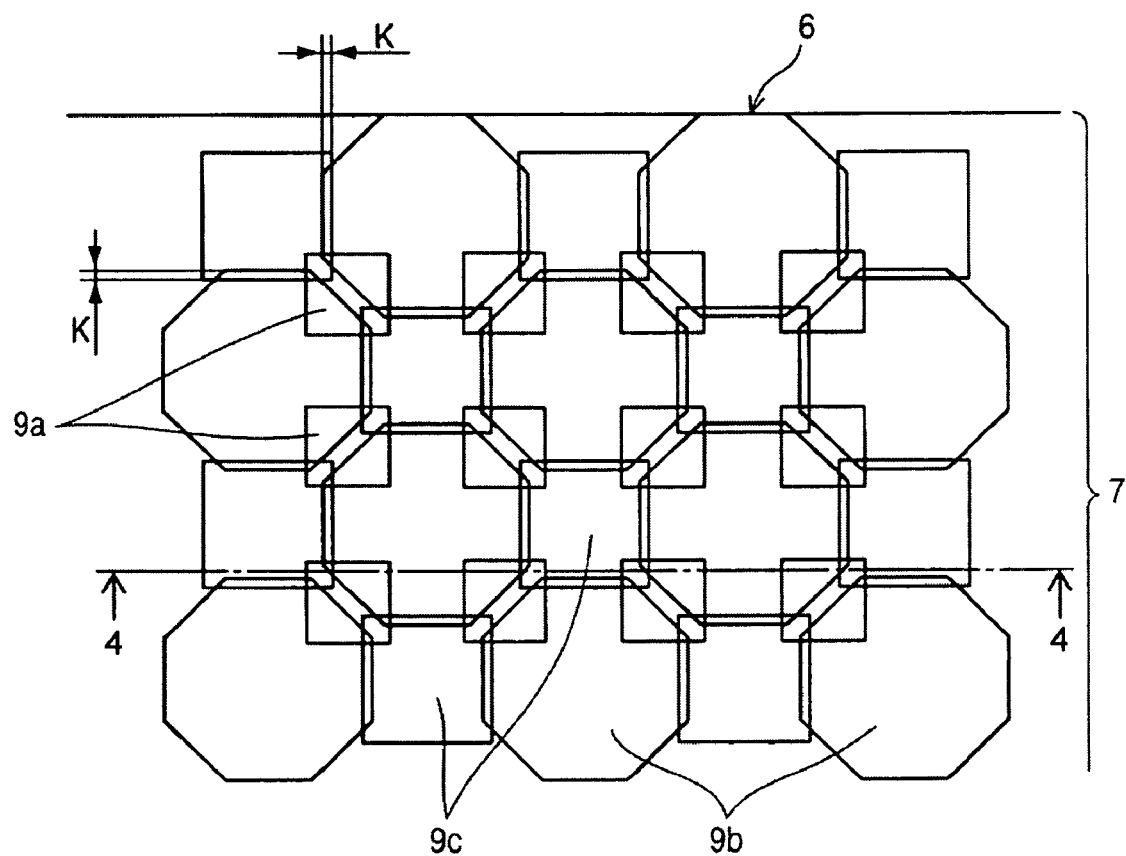
FIG. 3 is an enlarged view of a part B in FIG. 2 according to the embodiment of the present invention.
Figure 4:
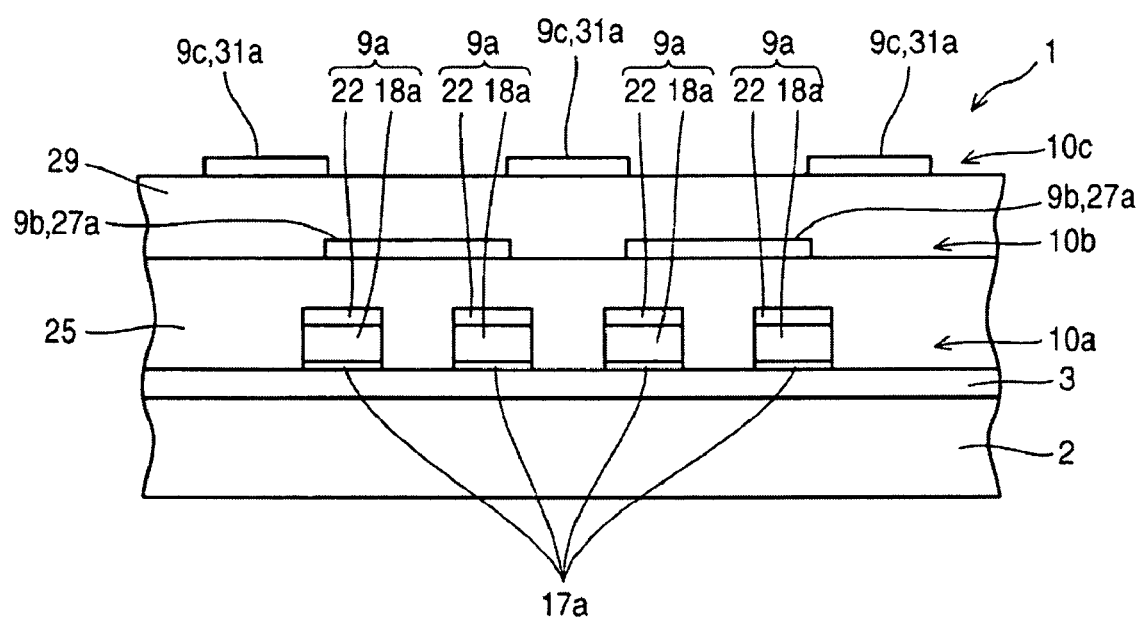
FIG. 4 is a schematic sectional view of the semiconductor wafer taken along a line 4-4 in FIG. 3 according to the embodiment of the present invention.

FIG. 1 is a schematic plan view showing a semiconductor wafer 1 according to an embodiment of the present invention. FIG. 2 is an enlarged view of a part A in FIG. 1 showing a scribe line of the semiconductor wafer 1 according to the embodiment of the present invention. FIG. 3 is an enlarged view of a part B in FIG. 2 according to the embodiment of the present invention. FIG. 4 is a schematic sectional view of the semiconductor wafer 1 taken along a line 4-4 in FIG. 3 according to the embodiment of the present invention.

Figure 5:
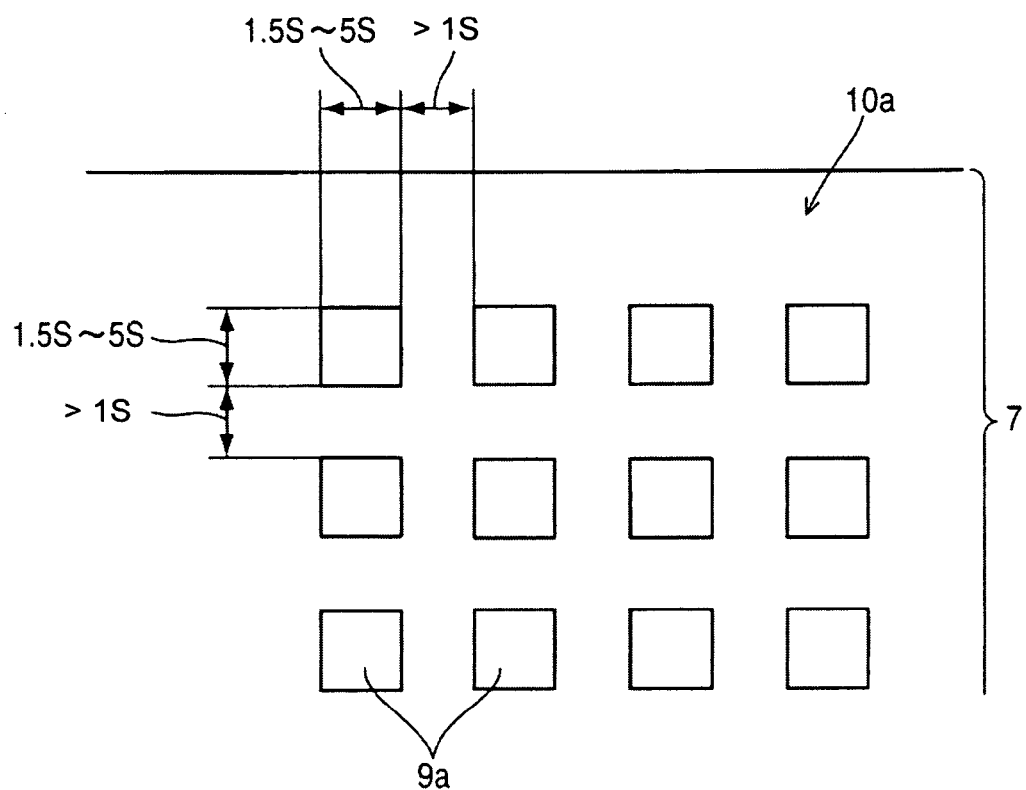
FIG. 5 is a schematic view showing a first opaque pattern layer of the semiconductor wafer according to the embodiment of the present invention.
Figure 6:
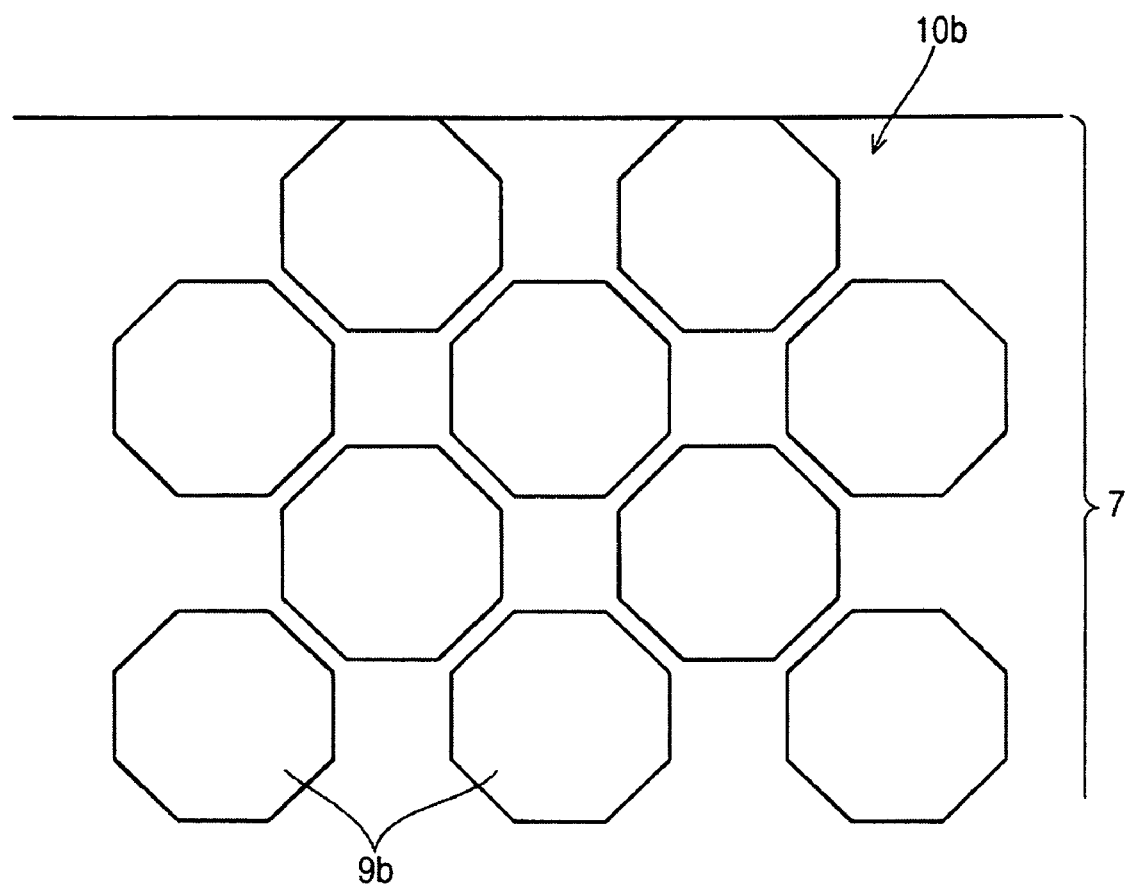
FIG. 6 is a schematic view showing a second opaque pattern layer of the semiconductor wafer according to the embodiment of the present invention.
Figure 7:
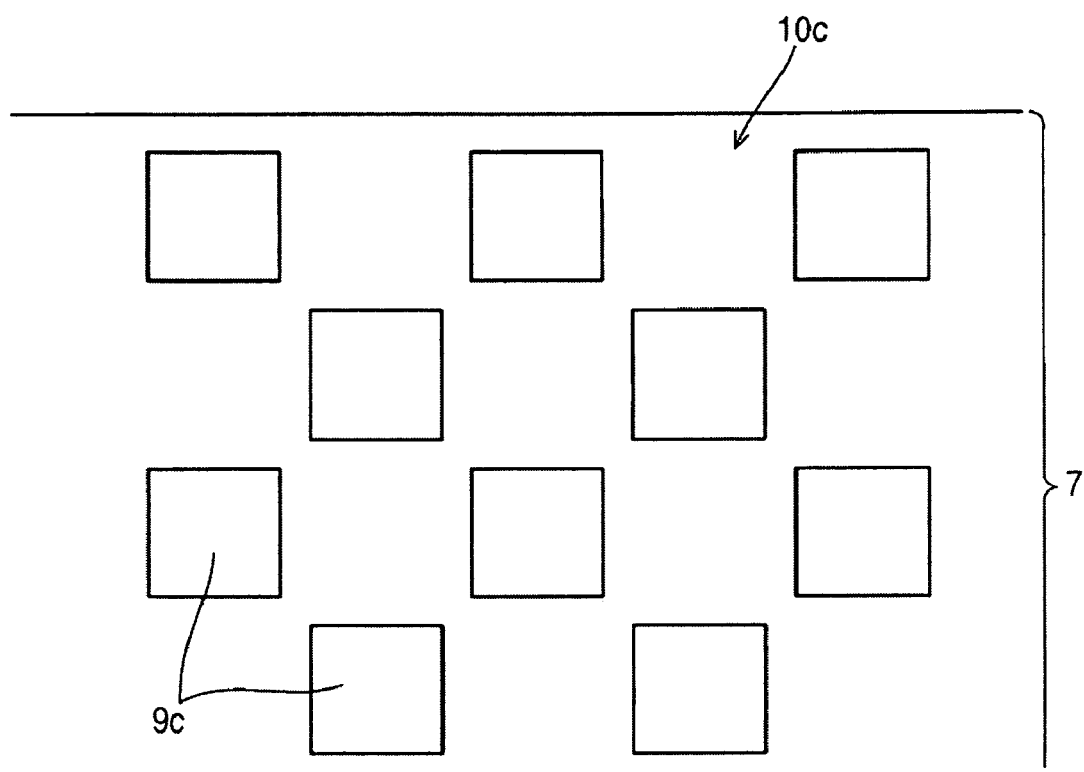
FIG. 7 is a schematic view showing a third opaque pattern layer of the semiconductor wafer according to the embodiment of the present invention.
Figure 8:
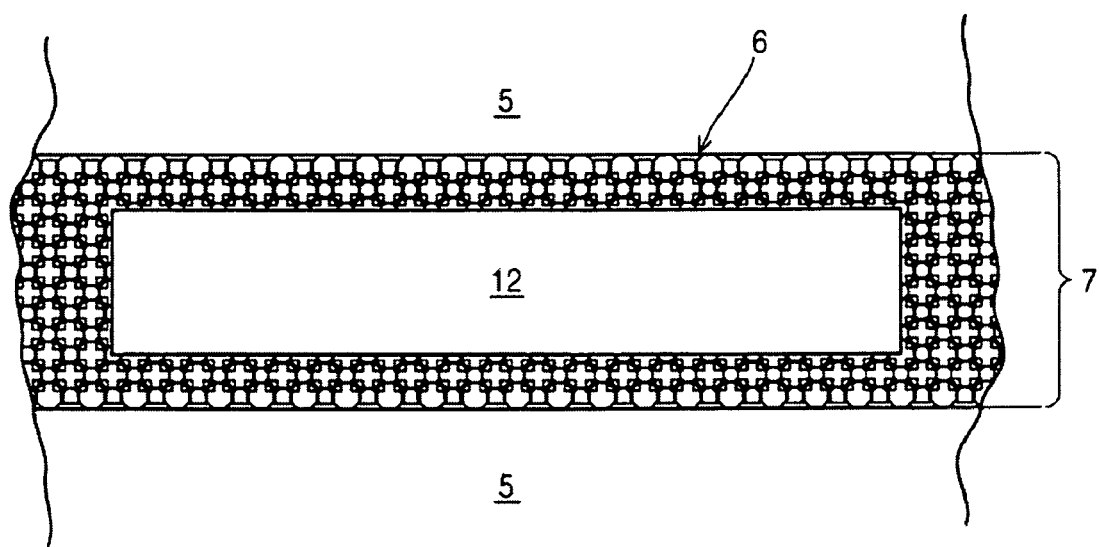
FIG. 8 is an enlarged view of a part D in FIG. 1 showing a scribe line of the semiconductor wafer according to the embodiment of the present invention.

FIG. 5 is a schematic view showing a first opaque pattern layer 10a of the semiconductor wafer 1 according to the embodiment of the present invention. FIG. 6 is a schematic view showing a second opaque pattern layer 10b of the semiconductor wafer 1 according to the embodiment of the present invention. FIG. 7 is a schematic view showing a third opaque pattern layer 10c of the semiconductor wafer 1 according to the embodiment of the present invention. FIG. 8 is an enlarged view of a part D in FIG. 1 showing a scribe line 6 of the semiconductor wafer 1 according to the embodiment of the present invention.

In the embodiment, the semiconductor wafer 1 is an SOS (Silicon on Sapphire) wafer. As shown in FIG. 4, the SOS wafer 1 includes a sapphire substrate 2 as an insulation substrate. The sapphire substrate 2 is a thin circular plate formed of a single crystal of aluminum oxide ($Al_2O_3$), and has transparency and excellent insulation property. Further, the SOS wafer 1 includes a semiconductor layer 3 formed on the sapphire substrate 2. The semiconductor layer 3 has a small thickness and is formed of single crystal silicon formed through solid state epitaxial growth of a silicon crystal.

In the embodiment, a plurality of chip forming areas 5 is defined on the SOS wafer 1 for forming semiconductor chips such as an LSI (Large Scale Integrated circuit) and the likes. In the semiconductor chip, semiconductor elements are connected through circuit wiring portions. The semiconductor elements include MOSFETs (Metal Oxide Semiconductor Field Effect Transistor) such as nMOS elements, memory elements, and the likes.

In the embodiment, scribe line forming areas 7 for forming the scribe lines 6 are defined on the SOS wafer 1, so that the scribe line forming areas 7 divide the chip forming areas 5. The scribe lines 6 function as dividing lines extending vertically and laterally for dividing the SOS wafer 1 into individual pieces during a manufacturing process of the semiconductor chips.

In the embodiment, the scribe line forming areas 7 have a width of about 50 μm to 300 μm in a width direction thereof (perpendicular to a boundary line between the scribe line forming areas 7 and the chip forming areas 5 and in parallel to an upper surface of the SOS wafer 1).

As shown in FIG. 2, the scribe line 6 is formed in the scribe line forming area 7. As shown in FIG. 3, in the scribe line 6, there are arranged a plurality of first opaque pattern portions 9a, a plurality of second opaque pattern portions 9b, and a plurality of third opaque pattern portions 9c.

As shown in FIG. 4, the first opaque pattern portions 9a are formed in a first opaque pattern layer 10a; the second opaque pattern portions 9b are formed in a second opaque pattern layer 10b; and the third opaque pattern portions 9c are formed in a third opaque pattern layer 10c. Further, the first opaque pattern layer 10a, the second opaque pattern layer 10b, and the third opaque pattern layer 10c are disposed between a first insulation layer 25 and a second insulation layer 29 (described later).

In the embodiment, a poly-silicon film 18a for forming a gate electrode 18 (described later) is patterned through photolithography. Then, silicide layers as metal conductive layers are laminated on the poly-silicon film 18a to form the first opaque pattern portions 9a in the first opaque pattern layer 10a.

As shown in FIG. 5, the first opaque pattern portions 9a have a rectangular shape having a side of between 1.5×S and 5.0×S, where S is a minimum exposure enable dimension (μm). Further, the first opaque pattern portions 9a are apart from each other by a distance larger than 1.0×S.

In the embodiment, a first wiring portion layer 27a is formed on the first insulation layer 25 using a conductive material used for forming first wiring portions 27. Then, the first wiring portion layer 27a is patterned through photolithography to form the second opaque pattern portions 9b in the second opaque pattern layer 10b.

As shown in FIGS. 3 and 6, the second opaque pattern portions 9b have an octagon shape covering a central space between four of the first opaque pattern portions 9a, and are arranged in a hound's tooth check pattern.

In the embodiment, a second wiring portion layer 31a is formed on the second insulation layer 29 using a conductive material same as that of the first wiring portion layer 27a used for forming second wiring portions 31. Then, the second wiring portion layer 31a is patterned through photolithography to form the third opaque pattern portions 9c in the third opaque pattern layer 10c.

As shown in FIGS. 3 and 6, the third opaque pattern portions 9c have a rectangular shape covering a large space between the second opaque pattern portions 9b arranged in the hound's tooth check pattern. The third opaque pattern portions 9 are arranged in a hound's tooth check pattern, and are overlapped with the second opaque pattern portions 9b by an overlap portion K (0.1 to 0.2 μm).

Accordingly, when the scribe line 6 is viewed from above, the first opaque pattern portions 9a formed in the first opaque pattern layer 10a; the second opaque pattern portions 9b formed in the second opaque pattern layer 10b; and the third opaque pattern portions 9c formed in the third opaque pattern layer 10c are overlapped with each other, thereby forming no space inbetween.

As shown in FIG. 8, the scribe line 6 may contain a TEG (Test Element Group) forming area 12. The TEG forming area 12 is formed in a rectangular area situated at a center portion of the scribe line forming area 7 in a width direction thereof, and is surrounded with the first opaque pattern portions 9a, the second opaque pattern portions 9b, and the third opaque pattern portions 9c.

In the embodiment, a plurality of TEG forming areas 12 is formed in the scribe line forming areas 7. A TEG (Test Element Group) is formed in the TEG forming area 12, and the TEG is formed of semiconductor elements same as those formed in the chip forming areas 5, or a plurality of elements having different sizes. With the TEG, it is possible to confirm an electrical property of the semiconductor elements formed in the chip forming areas 5.

FIGS. 9(A) to 9(D) are schematic sectional views showing the method of producing the SOS wafer 1 according to the embodiment of the present invention. FIGS. 10(A) and 10(B) are schematic sectional views showing the method of producing the SOS wafer 1 according to the embodiment of the present invention.

In each of FIGS. 9(A) to 9(D) and FIGS. 10(A) and 10(B), a sectional view of an nMOS element 15, i.e., one of the semiconductor elements formed in the chip forming areas 5, is shown on the left side, and a partial sectional view of the scribe line 6 formed in the scribe line forming area 7 is shown on the right side.

Figure 9:
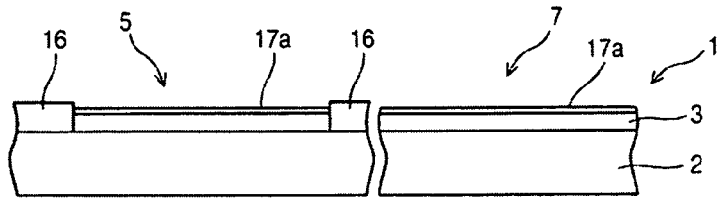
FIGS. 9(A) to 9(D) are schematic sectional views showing a method of producing the semiconductor wafer according to the embodiment of the present invention.
Figure 9:
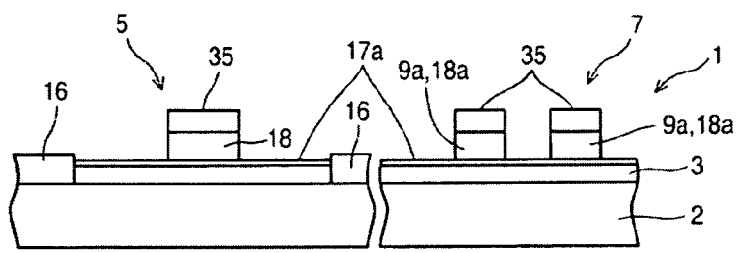
Figure 9:
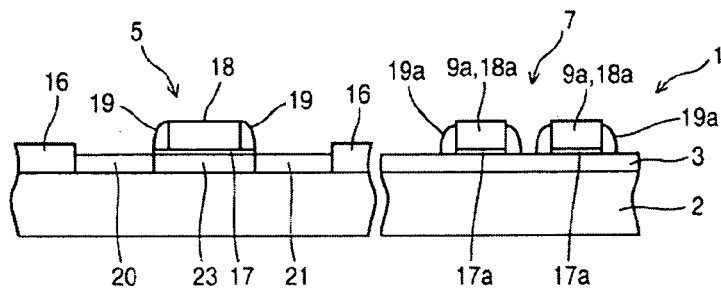
Figure 9:
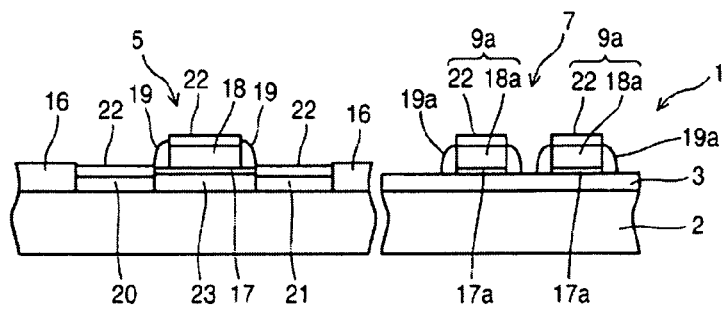
Figure 10:
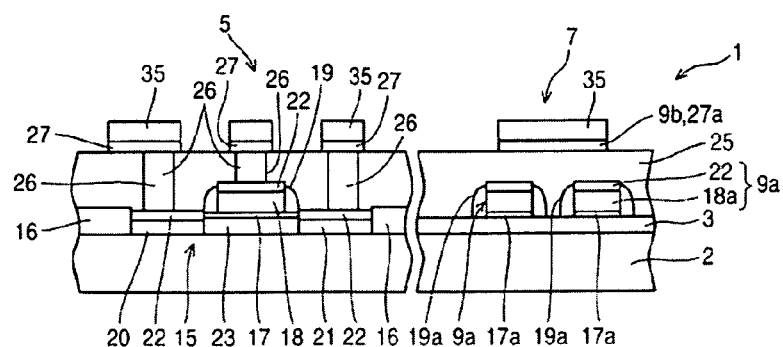
FIGS. 10(A) and 10(B) are schematic sectional views showing the method of producing the semiconductor wafer according to the embodiment of the present invention.
Figure 10:
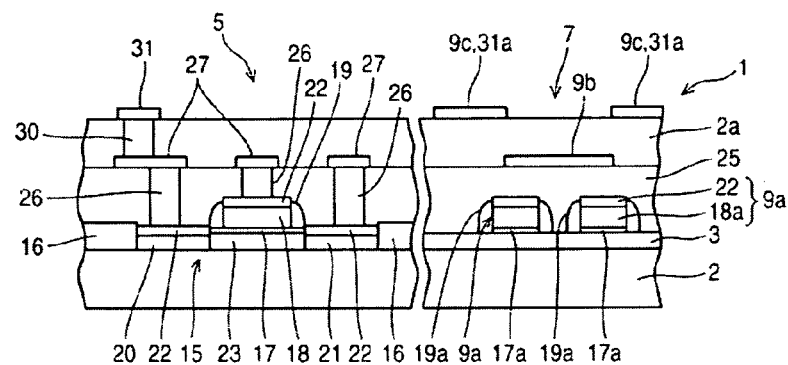

In the embodiment, as shown in FIG. 9(A), an element forming area is defined in the chip forming area 5 on the SOS wafer 1, and is surrounded and insulated with element separation layers 16 formed of an insulation material such as silicon oxide ($SiO_2$) and the likes. As shown in FIG. 10(A), the nMOS element 15 is formed in the semiconductor layer 3 on the sapphire substrate 2 in the element forming area.

In the embodiment, the semiconductor layer 3 is formed through diffusing a p-type impurity such as boron (B) at a relatively low concentration.

As shown in FIG. 10(B), the nMOS element 15 includes a gate insulation film 17 formed on the semiconductor layer 3; a gate electrode 18 arranged to face the semiconductor layer 3 with the gate insulation film 17 inbetween; sidewalls 19 disposed on side surfaces of the gate electrode 18; a source layer 20 disposed on one side of the gate electrode 18; a drain layer 21 disposed on the other side of the gate electrode 18; silicide layers 22 formed on the gate electrode 18, the source layer 20, and the drain layer 21; and the likes.

In the embodiment, the gate insulation film 17 is formed of silicon oxide and the likes; and the gate electrode 18 is formed of poly-silicon and the likes. Further, the sidewalls 19 are formed of silicon nitride ($Si_2N_4$) and the likes, and the source layer 20 and the drain layer 21 are formed through diffusing an n-type impurity such as phosphorous (P), arsenic (As), and the likes at a relatively high concentration. Further, the silicide layers 22 are formed of a compound of silicon and a metal material such as copper (Co), titanium (Ti), nickel (Ni), tungsten (W) and the likes.

In the embodiment, the semiconductor layer 3 with the p-type impurity diffused therein functions as a channel area 23 of the chip forming area 5 situated below the gate electrode 18 sandwiched between the source layer 20 and the drain layer 21. When a threshold voltage is applied to the gate electrode 18, a channel formed in the channel area 23 controls an electrical current flowing between the source layer 20 and the drain layer 21.

In the embodiment, the first insulation layer 25 is formed of silicon oxide and the likes, and covers the nMOS element 15. First wiring portions 27 are formed on the first insulation layer 25 for electrically connecting the gate electrode 18 of the nMOS element 15 and the silicide layers 22 of the source layer 20 and the drain layer 21 through contact plugs 26 formed of a conductive material such as tungsten, aluminum (Al), and the likes.

In the embodiment, the second insulation layer 29 is formed of an insulation material similar to that of the first insulation layer 25, and covers the first wiring portions 27. A second wiring portion 31 formed of a conductive material similar to that of the contact plugs 26 is formed on the second insulation layer 29 for electrically connecting the first wiring portions 27 through a contact plug 30 formed of a conductive material similar to that of the contact plugs 26.

In FIGS. 9(B) and 10(A), a resist of a positive type or a negative type is coated on the SOS wafer 1, and is exposed and developed through photolithography to form resist masks 35 as a mask member. The resist masks 35 function as masks in etching and ion implantation.

A method of producing the SOS wafer 1 having the scribe lines 6 will be explained next with reference to FIGS. 9(A) to 9(D) and FIGS. 10(A) and 10(B).

First, as shown in FIG. 9(A), the p-type impurity is diffused into the sapphire substrate 2 to form the semiconductor layer 3, thereby preparing the SOS wafer 1. Then, the scribe line forming areas 7 are defined on the semiconductor layer 3 in the vertical direction and the lateral direction, and the chip forming areas 5 divided with the scribe line forming areas 7 are defined.

In the next step, after the scribe line forming areas 7 and the chip forming areas 5 are defined on the semiconductor layer 3 of the SOS wafer 1, a pad oxide film is formed on the semiconductor layer 3 with a thermal oxidation method. Then, a silicon nitride film formed of silicon nitride is formed on the pad oxide film with a CVD (Chemical Vapor Deposition) method.

In the next step, the resist masks 35 are formed on the silicon nitride film through photolithography for covering the element forming areas defined in the chip forming area 5 and the TEG forming area 12, and the scribe line forming area 7. Then, the silicon nitride film is etched through anisotropy etching with the resist masks 35 as masks, so that the pad oxide film is exposed.

After the resist masks 35 are removed, the semiconductor layer 3 below the pad oxide film thus exposed is oxidized with an LOCOS (Local Oxidation Of Silicon) method with the silicon nitride film as a mask, thereby forming the element separation layers 16. Then, the silicon nitride film and the pad oxide film are removed through wet etching. Afterward, an upper surface of the semiconductor layer 3 is thermally oxidized with a thermal oxidation method to form silicon oxide films 17a for forming the gate insulation film 17.

In the next step, as shown in FIG. 9(B), poly-silicon is deposited on the silicon oxide films 17a with a CVD method to form poly-silicon films 18a with a relatively large thickness for forming the gate electrode 18. Then, the resist masks 35 are formed for covering a forming area of the gate electrode 18 in the chip forming area 5 and the TEG forming area 12, and forming areas of the first opaque pattern portions 9a in the scribe line forming area 7 except the TEG forming area 12. Afterward, the poly-silicon films 18a thus exposed are etched through anisotropy etching with the resist masks 35 as masks, so that the silicon oxide films 17a are exposed.

In the next step, the gate electrode 18 is formed on the semiconductor layer 3 in the chip forming area 5 and the TEG forming area 12. Further, the first opaque pattern portions 9a are formed on the semiconductor layer 3 in the scribe line forming area 7 except the TEG forming area 12 using the poly-silicon films 18a constituting the first opaque pattern layer 10a arranged in the vertical and lateral directions (refer to FIG. 5).

In the next step, as shown in FIG. 9(C), the resist masks 35 formed in the step shown in FIG. 9(B) are removed. Silicon nitride is deposited on a whole surface of the SOS wafer 1 including the gate electrode 18 and the first opaque pattern portions 9a to form silicon nitride films 19a for forming the sidewalls 19. Then, the silicon nitride films 19a and the poly-silicon films 18a thus exposed are etched through anisotropy etching, so that an upper surface of the gate electrode 18, an upper surface of the semiconductor layer 3, and upper surfaces of the first opaque pattern portions 9a are exposed. Accordingly, the gate insulation film 17 is formed between the gate electrode 18 and the semiconductor layer 3, and the sidewalls 19 are formed on the side surfaces of the gate electrode 18.

At this time, the poly-silicon films 18a remain between the first opaque pattern portions 9a and the semiconductor layer 3, and the silicon nitride films 19a remain on side surfaces of the poly-silicon films 18a.

In the next step, the resist masks 35 are formed through photolithography, so that the element forming area defined in the chip forming area 5 and the TEG forming area 12 is exposed. Then, n-type impurity ions are introduced into the semiconductor layer 3 thus exposed with the resist masks 35, the gate electrode 18, and the sidewalls 19 as masks. Accordingly, the source layer 20 and the drain layer 21 are formed in the semiconductor layer 3 with the n-type impurity diffused at a relatively high concentration on the both sides of the gate electrode 18. Afterward, the resist masks 35 are removed.

Accordingly, as shown in FIG. 9(D), the channel area 23 is formed in the semiconductor layer 3 below the gate electrode 18 between the source layer 20 and the drain layer 21. Cobalt is deposited with a sputtering method and the likes on a whole surface of the SOS wafer 1 including the gate electrode 18, the first opaque pattern portions 9a, the source layer 20, and the drain layer 21 to form a metal material layer.

Then, the metal material layer contacting with silicon on the gate electrode 18, the source layer 20, the drain layer 21, and the first opaque pattern portions 9a becomes silicide through a silicide processing, thereby forming the silicide layers 22 at respective positions. In the silicide processing, an annealing processing is performed and an un-reacted portion of the metal material layer is removed.

In the next step, as shown in FIG. 10(A), after the silicide layers 22 are formed, silicon oxide is deposited for a relatively large thickness on a whole surface of the SOS wafer 1 including the silicide layers 22 and the element separation layers 16. Then, an upper surface of the silicon oxide layer is flattened to form the first insulation layer 25.

In the next step, the resist masks 35 are formed on the first insulation layer 25 through photolithography, so that the resist masks 35 have opening portions exposing the first insulation layer 25 in forming areas of the contact plugs 26 on the silicide layers 22 of the source layer 20 and the drain layer 21. Then, the first insulation layer 25 is etched through anisotropy etching with the resist masks 35 as masks, so that contact holes are formed to penetrate the first insulation layer 25 and reach the silicide layers 22 of the source layer 20 and the drain layer 21.

In the next step, after the resist masks 35 are removed, a conductive material is filled in the contact holes with a sputtering method and the likes to form the contact plugs 26. Then, upper surfaces of the contact plugs 26 are flattened, so that an upper surface of the first insulation layer 25 is exposed.

In the next step, similar to the steps described above, a conductive material is filled in a contact hole reaching the silicide layer 22 of the gate electrode 18 to form the contact plug 26. Then, an upper surface of the contact plug 26 is flattened, so that an upper surface of the first insulation layer 25 is exposed.

In the next step, the first wiring portion layer 27a is formed on the first insulation layer 25 with a sputtering method and the likes using a conductive material similar to that of the contact plugs 26 for forming first wiring portions 27. Then, the resist masks 35 are formed through photolithography for covering forming areas of the first wiring portions 27 in the chip forming area 5 and the TEG forming area 12, and forming areas of the second opaque pattern portions 9b in the scribe line forming area 7 except the TEG forming area 12.

In the next step, the first wiring portion layer 27a is etched with the resist masks 35 as masks to form the first wiring portions 27 for electrically connecting the contact plugs 26. At the same time, the second opaque pattern portions 9b are formed on the first insulation layer 25 in the scribe line forming area 7 except the TEG forming area 12 from the first wiring portion layers 27a constituting the second opaque pattern layer 10b and arranged in the hound's tooth check pattern (refer to FIG. 6).

In the next step, as shown in FIG. 10(B), after the resist masks 35 formed in the step shown in FIG. 10(A) are removed, similar to the first insulation layer 25, the first wiring portions 27 is formed on a whole surface of the SOS wafer 1 including the first wiring portions 27 and the second opaque pattern portions 9b. Then, the resist masks 35 are formed on the second insulation layer 29 through photolithography, so that the resist masks 35 have opening portions exposing the second insulation layer 29 in a forming area of the contact plug 30 on the first wiring portion 27.

In the next step, the second insulation layer 29 is etched with the resist masks 35 as masks, so that a through hole is formed to penetrate the second insulation layer 29 and reach the first wiring portion 27. After the resist masks 35 are removed, a conductive material similar to that of the contact plugs 26 is filled in the through hole and formed on the second insulation layer 29 with a sputtering method and the likes, so that the contact plug 30 is formed, and a second wiring portion layer 31a is formed on the second insulation layer 29 for forming the second wiring portion 31.

In the next step, the resist masks 35 are formed through photolithography for covering a forming area of the second wiring portion 31 in the chip forming area 5 and the TEG forming area 12, and forming areas of the third opaque pattern portions 9c in the scribe line forming area 7 except the TEG forming area 12. Then, the second wiring portion layer 31a is etched to form the second wiring portion 31 electrically connected to the contact plug 30. At the same time, the third opaque pattern portions 9c are formed on the second insulation layer 29 in the scribe line forming area 7 except the TEG forming area 12 from the second wiring portion layer 31a constituting the third opaque pattern layer 10c and arranged in the hound's tooth check pattern (refer to FIG. 7).

In the embodiment, the SOS wafer 1 having the scribe lines 6 is produced through the steps described above. After an electrical property of the semiconductor elements formed in the chip forming areas 5 is confirmed with elements of TEG formed in the TEG forming areas 12, a dicing blade cuts the SOS wafer 1 along centerlines of the scribe lines 6 to divide the SOS wafer 1 into individual pieces, thereby producing the semiconductor chips.

As described above, in the embodiment, in the scribe line forming areas 7, the first opaque pattern portions 9a are formed in the first opaque pattern layer 10a; the second opaque pattern portions 9b are formed in the second opaque pattern layer 10b; and the third opaque pattern portions 9c are formed in the third opaque pattern layer 10c.

Accordingly, utilizing the opaqueness of the first opaque pattern portions 9a, the second opaque pattern portions 9b, and the third opaque pattern portions 9c, it is possible to improve a recognition rate of the SOS wafer 1 without reducing the chip forming areas 5 upon processing with a production device in the production steps after the first opaque pattern portions 9a, the second opaque pattern portions 9b, and the third opaque pattern portions 9c are formed. As a result, it is possible to prevent the SOS wafer 1 from passing the production steps without being recognized, thereby improving production efficiency of the semiconductor chips.

As described above, in the embodiment, it is possible to improve the recognition rate of the SOS wafer 1 especially when the production device has a transmission type sensor for detecting a center portion of the SOS wafer 1. Further, the scribe line forming areas 7 are defined in the circumferential edge portion of the SOS wafer 1. Accordingly, it is possible to improve the recognition rate of the SOS wafer 1 even when the production device has a transmission type sensor for detecting a circumferential edge portion of the SOS wafer 1.

Further, in the embodiment, in the scribe line forming areas 7, the first opaque pattern portions 9a are formed of the poly-silicon films 18a; the second opaque pattern portions 9b are formed of the first wiring portion layers 27a; and the third opaque pattern portions 9c are formed of the second wiring portion layers 31a.

Accordingly, using the resist masks 35 for forming the semiconductor elements such as the gate electrodes of the nMOS elements 15, the first wiring portions 27, and the second wiring portions 31, it is possible to form the first opaque pattern portions 9a, the second opaque pattern portions 9b, and the third opaque pattern portions 9c for improving the recognition rate of the SOS wafer 1 without an additional step.

Even when a transmission type sensor is used using light having a wavelength of 670 to 940 nm, it is possible to easily detect the SOS wafer 1. Accordingly, in the production steps of producing the semiconductor chips using a silicon wafer, it is possible to produce the semiconductor chips using the SOS wafer 1.

As described above, in the embodiment, the silicide layers 22 as the metal conductive layers are formed on the first opaque pattern portions 9a formed of the poly-silicon films 18a. In this case, it is possible to further increase the opaqueness of the first opaque pattern portions 9a.

When the first wiring portion layers 27a are formed on whole surfaces of the scribe line forming areas 7 as opaque layers, and a dicing blade cuts the SOS wafer 1 along the scribe lines 6, cut chips of the metal conductive layers having an elongated whisker shape may be produced. Accordingly, the dicing blade may be clogged. It may be difficult to wash the cut chips, thereby causing short circuit between bonding pads.

As described above, in the embodiment, the first insulation layer 25 and the second insulation layer 29 are situated between the first opaque pattern layer 10a, the second opaque pattern layer 10b, and the third opaque pattern layer 10c in the scribe line 6. Further, the first opaque pattern portions 9a are arranged in the first opaque pattern layer 10a apart from each other; the second opaque pattern portions 9b are arranged in the second opaque pattern layer 10b apart from each other; and the third opaque pattern portions 9c are arranged in the third opaque pattern layer 10c apart from each other.

Accordingly, when the dicing blade cuts the SOS wafer 1 along the scribe lines 6, it is possible to reduce a size of cut chips formed of the metal conductive films, thereby preventing the dicing blade from being clogged. Further, it is easy to wash the cut chips, thereby preventing short circuit between bonding pads due to the cut chips.

As described above, in the embodiment, the first opaque pattern portions 9a, the second opaque pattern portions 9b, and the third opaque pattern portions 9c are arranged to surround the TEG forming areas 12 defined in the scribe line forming areas 7. Accordingly, when the transmission type sensor traces the SOS wafer 1, even through light thus irradiated passes through the TEG forming areas 12, the first opaque pattern portions 9a, the second opaque pattern portions 9b, and the third opaque pattern portions 9c formed around the TEG forming areas 12 block light. Accordingly, it is possible to detect the SOS wafer 1 with the transmission type sensor at a high recognition rate.

As described above, in the embodiment, the opaque pattern layer is disposed in the scribe line area, and a plurality of opaque pattern portions is arranged apart from each other in the opaque pattern layer.

Accordingly, utilizing the opaqueness of the opaque pattern portions, it is possible to improve the recognition rate of the SOS wafer without reducing the set area of the chip forming areas. As a result, it is possible to improve a yield in producing the semiconductor chips, and to improve production efficiency of the semiconductor chips.

Further, in the embodiment, a plurality of opaque pattern layers is disposed, and a plurality of opaque pattern portions is arranged apart from each other in the opaque pattern layers. The interlayer insulation film is disposed between the opaque pattern layers. The opaque pattern portions in one of the opaque pattern layers are arranged to cover the spaces between the opaque pattern portions in another of the opaque pattern layers.

Accordingly, it is possible to securely block light irradiated from the transmission type sensor. Further, it is possible to reduce a size of cut chips upon diving the SOS wafer into individual pieces. As a result, it is easy to wash the cut chips, thereby preventing short circuit between bonding pads.

Further, in the embodiment, in each of the opaque pattern layers in the scribe line forming areas, the first opaque pattern portions are formed of the poly-silicon films; the second opaque pattern portions are formed of the first wiring portion layers; and the third opaque pattern portions are formed of the second wiring portion layers.

Accordingly, using the resist masks for forming the semiconductor elements such as the gate electrodes of the semiconductor elements, the first wiring portions, and the second wiring portions formed in the chip forming areas, it is possible to form the opaque pattern portions for improving the recognition rate of the SOS wafer without an additional step.

Further, in the embodiment, the opaque pattern portions are arranged to surround the TEG forming areas defined in the scribe line areas. Accordingly, when the transmission type sensor traces the SOS wafer, even through light thus irradiated passes through the TEG forming areas, the opaque pattern portions formed around the TEG forming areas securely block light.

Note that, in the embodiment, the transmission type sensor of the optical type detects the presence of the SOS wafer. A reflective type sensor of an optical type may be used for detecting light reflected on the opaque pattern portions to recognize the presence of the SOS wafer.

Further, in the embodiment, the first opaque pattern portions are formed in the rectangular shape; the second opaque pattern portions are formed in the octagon shape; and the third opaque pattern portions are formed in the rectangular shape. The shapes of the opaque pattern portions are not limited thereto, and may be other polygon shapes as far as the cut chips has a small size upon diving the SOS wafer.

Further, in the embodiment, the interlayer insulation films are disposed at the two layers, and may be disposed more than three layers in the SOS wafer. In this case, the opaque pattern portions formed of the poly-silicon films may be omitted, and the opaque pattern portions may be formed in each of the opaque pattern layers using the wiring portion layers to be formed on each of the interlayer insulation films.

Further, in the embodiment, the semiconductor wafer is the SOS wafer, and may be an SOQ (Silicon On Quartz) substrate having a silicon semiconductor layer formed on a quartz substrate as an insulation substrate with transparency.

The disclosure of Japanese Patent Application No. 2007-169660, filed on Jun. 27, 2007, is incorporated in the application by reference.

While the invention has been explained with reference to the specific embodiments of the invention, the explanation is illustrative and the invention is limited only by the appended claims.

What is claimed is:

1. A semiconductor wafer, comprising:
   an insulation substrate with transparency;
   a silicon semiconductor layer formed on the insulation substrate;
   a chip forming area defined on the silicon semiconductor layer;
   a scribe line area defined on the silicon semiconductor layer for dividing the chip forming area;
   an opaque pattern layer formed in the scribe line area, said opaque pattern layer including a first opaque pattern layer and a second opaque pattern layer; and
   a plurality of opaque pattern portions arranged apart from each other in the opaque pattern layer.

2. The semiconductor wafer according to claim 1, further comprising an interlayer insulation film disposed between the first opaque pattern layer and the second opaque pattern layer.

3. The semiconductor wafer according to claim 1, wherein said opaque pattern portions include first opaque pattern portions formed in the first opaque pattern layer and second opaque pattern portions formed in the second opaque pattern layer, said first opaque pattern portions being arranged to cover spaces between the second opaque pattern portions in a plan view.

4. The semiconductor wafer according to claim 1, wherein said opaque pattern portions are formed of a metal conductive film.

5. The semiconductor wafer according to claim 3, wherein at least ones of said first opaque pattern portions and said second opaque pattern portions are formed of a poly-silicon film.

6. The semiconductor wafer according to claim 3, wherein at least ones of said first opaque pattern portions and said second opaque pattern portions are arranged apart from each other by a distance greater than a minimum exposure enable distance.

7. The semiconductor wafer according to claim 1, further comprising a TEG (Test Element Group) forming area defined in the scribe line forming area so that a TEG can be formed in the TEG forming area for confirming an electrical property of a semiconductor element, said TEG forming area being surrounded by the opaque pattern portions.

* * * * *